United States Patent
Chen

(10) Patent No.: US 8,587,077 B2
(45) Date of Patent: Nov. 19, 2013

(54) INTEGRATED COMPACT MEMS DEVICE WITH DEEP TRENCH CONTACTS

(75) Inventor: Kun-Lung Chen, Hsinchu (TW)

(73) Assignee: WindTop Technology Corp., Hsinchu (TW)

( * ) Notice: Subject to any disclaimer, the term of this patent is extended or adjusted under 35 U.S.C. 154(b) by 37 days.

(21) Appl. No.: 13/342,129

(22) Filed: Jan. 2, 2012

(65) Prior Publication Data

US 2013/0168740 A1 Jul. 4, 2013

(51) Int. Cl.
*H01L 29/84* (2006.01)
(52) U.S. Cl.
USPC .......................................... 257/416; 257/254
(58) Field of Classification Search
CPC ................ B81B 2201/0221; H04R 19/005
USPC .................... 257/415, 416, 417, 418, 254
See application file for complete search history.

(56) References Cited

U.S. PATENT DOCUMENTS

| | | | |
|---|---|---|---|
| 7,786,560 B2* | 8/2010 | Hong | 257/680 |
| 7,898,081 B2* | 3/2011 | Lan et al. | 257/734 |
| 2003/0104649 A1* | 6/2003 | Ozgur et al. | 438/50 |
| 2010/0109103 A1* | 5/2010 | Tsao | 257/418 |
| 2010/0171153 A1* | 7/2010 | Yang | 257/254 |
| 2010/0288047 A1* | 11/2010 | Takagi | 73/514.32 |

* cited by examiner

*Primary Examiner* — Nikolay Yushin

(57) ABSTRACT

A compact MEMS motion sensor device is provided, including a CMOS substrate layer, with plural anchor posts having an isolation oxide layer surrounding a conductive layer. On one side of the CMOS substrate layer, the device further includes a field oxide (FOX) layer, a first set and a second set of implant doped silicon areas, a first polysilicon layer, an oxide layer embedded with plural metal layers interleaved with via hole layers, a Nitride deposition layer, an under bump metal (UBM) layer and a plurality of solder spheres. On the other side of the CMOS substrate layer, it further includes a backside interconnect isolation oxide layer, a first MEMS bonding layer, a first metal compound layer, a second MEMS bonding layer, a MEMS layer, a first MEMS eutectic bonding layer, a second metal compound layer, a second MEMS eutectic bonding layer, and a MEMS cap layer.

19 Claims, 19 Drawing Sheets

INTEGRATED COMPACT MEMS DEVICE WITH DEEP TRENCH CONTACTS

FIELD OF THE INVENTION

The present invention generally relates to an integrated compact MEMS device with deep trench contacts, and more specifically to an integrated compact MEMS device with deep trench polysilicon contacts to connect CMOS ASIC circuit and MEMS module, applicable to both wafer-level flip chip package and wire bonding technologies.

BACKGROUND OF THE INVENTION

Most of the conventional MEMS devices or motion sensors have been composed of a MEMS die and an ASIC die, and then a wire bonding package technology is used to bond these two dies together. FIG. 1A shows a schematic view of an exemplary wire bonding package embodiment. As shown in FIG. 1A, a MEMS die 102 and an ASIC die 103 are attached to a lead frame 101. Bond wires 104 are then used to connect MEMS die 102, ASIC die 103 and lead frame 101. A CAP 105 is then attached to MEMS die 102. The drawbacks are that package processes are often complicated because wafer probing is needed on both MEMS and ASIC dies separately. Since the signals from MEMS dies are very small, the wafer probing on it is quite a challenge. Because of the complexity of two-die package, the final device tends to become large in package size in planar X-Y dimension, as shown in FIG. 1A. FIG. 1B shows another schematic view of an exemplary wire bonding package embodiment. As shown in FIG. 1B, a MEMS die 102 stacked on an ASIC die 103 on lead frame 101 with a CAP 105 on MEMS die 102 will result in a large size in vertical Z-dimension. By using the conventional methods to form MEMS devices, wafer level flip chip technology cannot be used in fabricating MEMS devices.

Several semi CMOS MEMS types of process using single-chip technology to manufacture MEMS motion sensor have been proposed. However, the drawbacks of these methods are that Flip Chip bumping process cannot be performed and thus neither wafer-level package (WLP) nor chip scale package (CSP) is possible. Also, the cap wafer needs to have a plurality of open holes 106 to allow for pad opening for wire bonding, i.e., wire bond window (WBW), to ASIC die 103, as shown in FIG. 1C.

It is therefore imperative to devise a novel structure for single-chip MEMS motion sensor to overcome the aforementioned drawbacks and to meet the present demands of increasingly wide range of applications.

SUMMARY OF THE INVENTION

The primary object of the present invention is to provide a novel structure of single-chip compact MEMS motion sensor, wherein MEMS is made with CMOS wafer as a foundation to form a single chip compact MEMS device compatible with flip chip package capability. The present invention utilizes CMOS trench polysilicon interconnects for MEMS signal and anchors. The advantage to use polysilicon deep trench interconnect is that polysilicon deep trench is compatible with CMOS process in term of material characteristics and also conformal during film deposition so that high aspect ratio deep trench contacts and thus interconnects can be realized.

Another object of the present invention is to provide a compact MEMS device able to be fabricated with both wafer level package (WLP) flip chip capability and wire bonding capability. A deep trench polysilicon contact is formed through a CMOS silicon substrate for the purpose of making connection to the MEMS devices which are later attached to the backside of the CMOS silicon wafer using wafer to wafer bonding technology. The polysilicon trench is made on the blanket silicon wafer before CMOS device formation to avoid disturbance to the CMOS device characteristics. Silicon etch and oxide deposition and metal interconnect were performed at the backside of the CMOS wafer substrate by using a wafer carrier on the top side of the CMOS wafer. The trench polysilicon serves as both signal interconnects and anchors for the MEMS device when combined with surrounding silicon. MEMS devices wafer is bonded onto the CMOS substrate where interconnects are made and MEMS wafer thinned to a desired thickness. A simplified silicon cap made of silicon wafer is wafer bonded with hermetic seal to the CMOS MEMS device with small dimension. A highly capacitive and reliable Oxide-Nitride-Oxide (ONO) dielectric can be used to form a highly capacitive polysilicon trench capacitor for ASIC circuit design simultaneously. A vertical coaxial cable can be formed to minimize a stray capacitance of a signal connection line in this invention.

To achieve the aforementioned object, the present invention provides a compact MEMS device of a motion sensor, including a CMOS substrate layer, with a plurality of anchor posts having an isolation oxide layer surrounding a conductive layer. On one side of CMOS substrate layer, a CMOS ASIC module is fabricated. Hence, the CMOS ASIC module of the present invention further includes a field oxide (FOX) layer, a first set of implant doped silicon areas, a second set of implant doped silicon areas, a first polysilicon layer, an oxide layer embedded with a plurality of metal layers interleaved with a plurality of via hole layers, a Nitride deposition layer, an under bump metal (UBM) layer and a plurality of solder spheres. On the other side of CMOS substrate layer, a MEMS device module is attached. Hence, the MEMS device module of the present invention further includes a backside interconnect isolation oxide layer, a first MEMS bonding layer, a first metal compound layer, a second MEMS bonding layer, a MEMS layer, a first MEMS eutectic bonding layer, a second metal compound layer, a second MEMS eutectic bonding layer, and a MEMS cap layer. It is also worth noting that a plurality of cavities exists between back side interconnect isolation oxide layer and second MEMS bonding layer, a plurality of via holes exists in MEMS layer forming MEMS motion fingers, and a gap exists between MEMS layer and MEMS cap layer. Via holes in MEMS layer connect cavities and gap.

First set of implant doped silicon areas forms CMOS wells, second set of implant doped silicon areas forms CMOS transistor sources/drains, first polysilicon layer form CMOS transistor gates, and said CMOS wells, said CMOS transistor sources/drains and said CMOS gates form CMOS transistors. A first via hole layer also acts as CMOS contact, and the remaining via hole layers are as CMOS vias. UBM layer and said solder spheres form a flip chip bump layer. First MEMS bonding layer, first metal compound layer, and second MEMS bonding layer form a MEMS bonding area between MEMS layer and CMOS substrate layer. First metal compound layer is resulted from an eutectic bonding process between first MEMS bonding layer and second MEMS bonding layer. Similarly, first MEMS eutectic bonding layer, second metal compound layer, and second EMS eutectic bonding layer form a MEMS bonding area between MEMS layer and MEMS cap layer. Second metal compound layer is resulted from an eutectic bonding process between first MEMS eutectic bonding layer and second MEMS eutectic bonding layer.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 2:
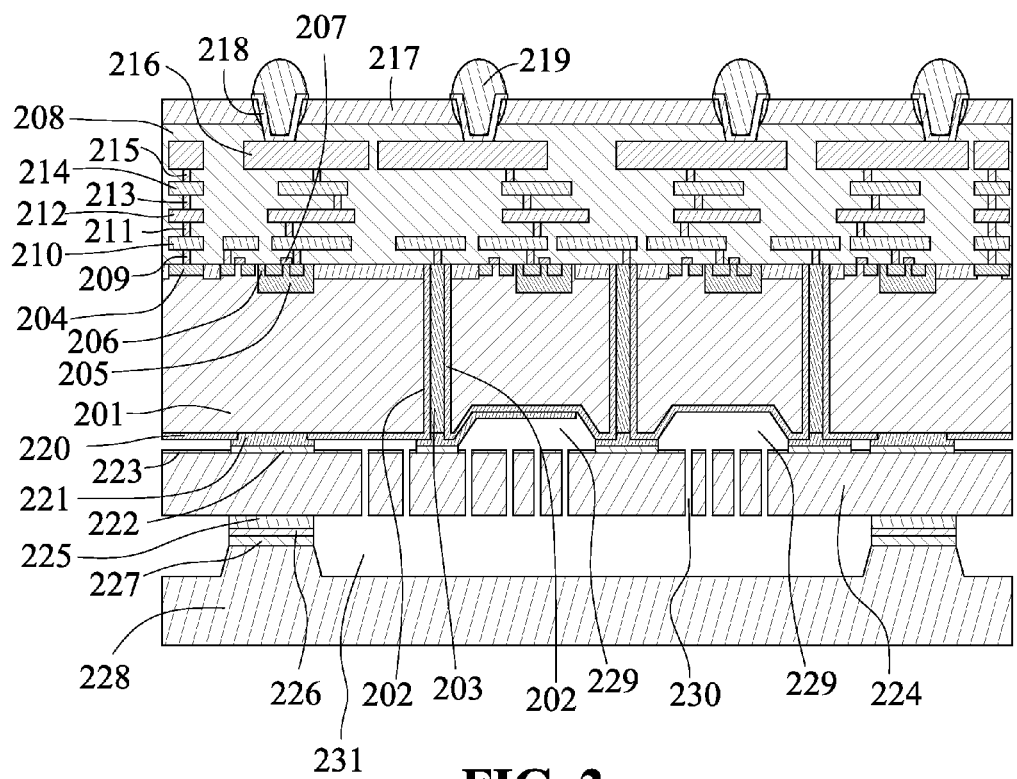
FIG. 2 shows a schematic view of a compact MEMS motion sensor device according to the present invention.

FIG. 2 shows a schematic view of an exemplary embodiment of a structure of an integrated compact MEMS device made with the flip chip technology according to the present invention. However, if the CMOS ASIC circuit is made with bond pads for wire bonding, the resulting device based on the present invention will yield an integrated MEMS device for a lead frame base wire bonding package. As shown in FIG. 2, the compact MEMS device of a motion sensor includes a CMOS substrate layer 201 made of Si silicon, with a plurality of anchor posts penetrating CMOS substrate layer having an isolation oxide layer 202 on the outside surrounding a conductive layer 203. On one side of CMOS substrate layer 201, the structure of the present invention further includes a field oxide (FOX) layer 204, a first set of implant doped silicon areas 205, a second set of implant doped silicon areas 206, a first polysilicon layer 207, an oxide layer 208 embedded with a plurality of metal layers interleaved with a plurality of via hole layers, wherein this exemplary embodiment shows four metals and four via hole layers, including a first via hole layer 209, a first metal layer 210, a second via hole layer 211, a second metal layer 212, a third via hole layer 213, a third metal layer 214, a fourth via hole layer 215, and a fourth metal layer 216, a Nitride deposition layer 217, an under bump metal (UBM) layer 218 and a plurality of solder spheres 219, said UBM layer 218 and said solder spheres 219 forming a flip chip bump layer. On the other side of CMOS substrate layer 201, the structure of the present invention further includes a backside interconnect isolation oxide layer 220 to isolate CMOS substrate layer 201 from subsequent MEMS process, a first MEMS bonding layer 221 attached to CMOS substrate layer 201, a first metal compound layer 222, a second MEMS bonding layer 223 for attaching to upper surface of a MEMS layer 224, a first MEMS eutectic bonding layer 225 for attaching to lower surface of MEMS layer 224, a second metal compound layer 226, a second MEMS eutectic bonding layer 227 for attaching to a MEMS cap layer 228. It is also worth noting that a plurality of cavities 229 exists between back side interconnect isolation oxide layer 220 and second MEMS bonding layer 223, a plurality of via holes 230 exists in MEMS layer 224, and a large gap 231 exists between MEMS layer 224 and MEMS cap layer 228. Via holes 230 in MEMS layer 224 connect cavities 229 and gap 231.

Figure 1A:
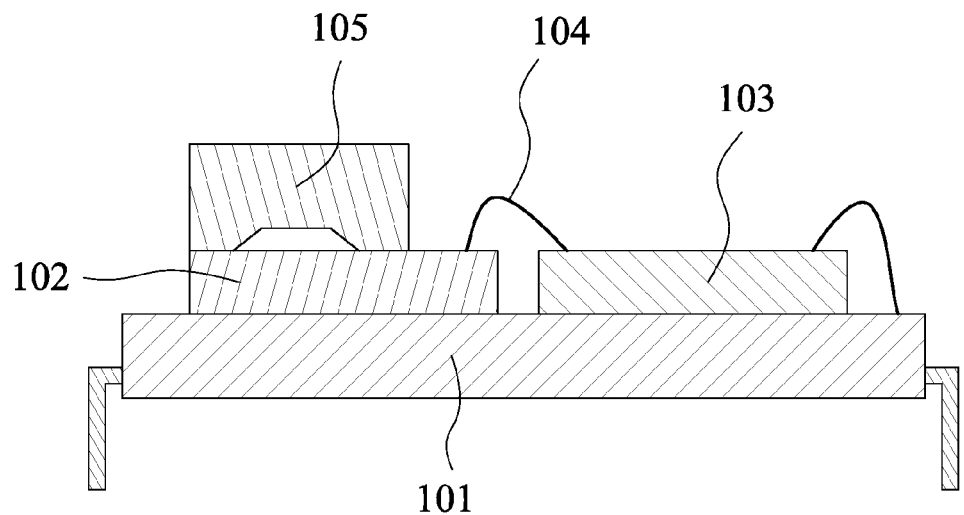
FIG. 1A shows a schematic view of a conventional exemplary wire bonding package embodiment.
Figure 1B:
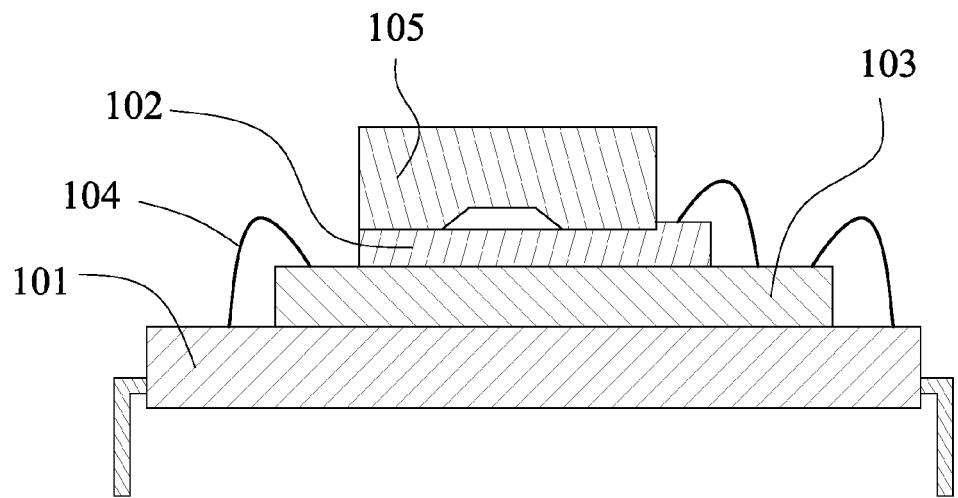
FIG. 1B shows a schematic view of another conventional exemplary wire bonding package embodiment.
Figure 1C:
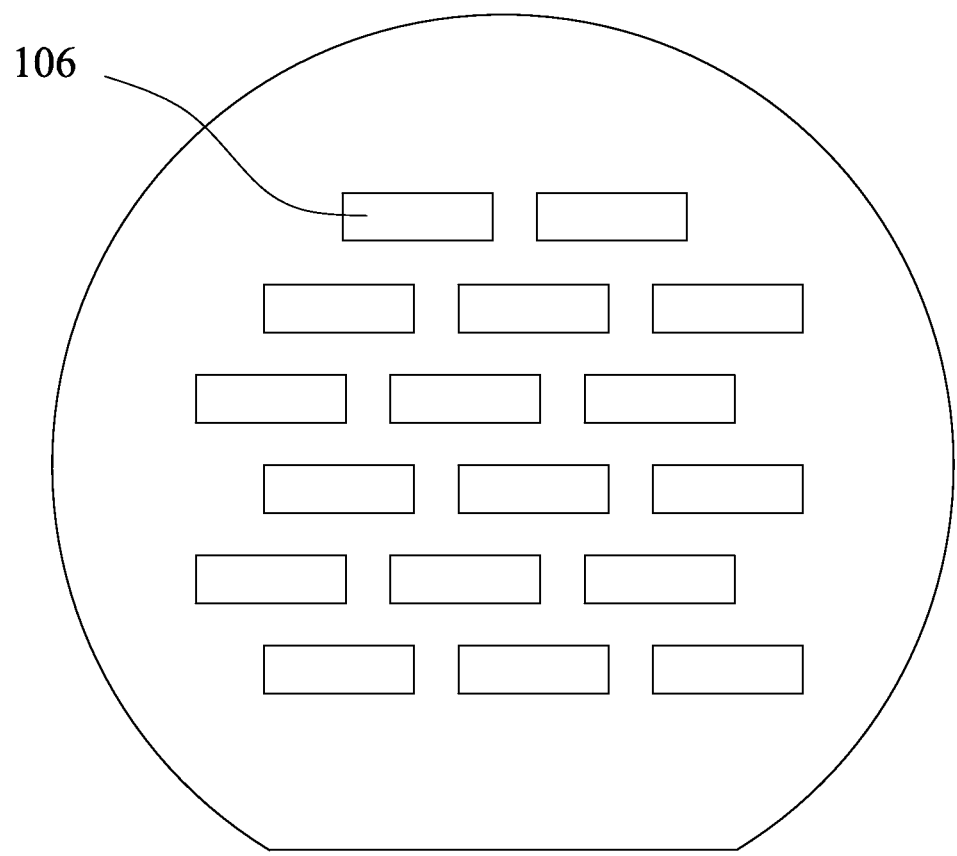
FIG. 1C shows a schematic view of a cap with wire bond windows opening for conventional wire bonding package technology.

For each layer, a plurality of preferred materials can be used. The following description is only for illustrative purpose, not restrictive purpose. Equivalent materials can also be used to substitute. For example, CMOS substrate layer 201 is made of Si, anchor post isolation oxide layer 202 can be made of $SiO_2$, and anchor post conductive layer 203 can be made of doped polysilicon. Field oxide layer 204 and oxide layer 208 can be both made of $SiO_2$. First set of implant doped silicon areas 205 forms CMOS wells, second set of implant doped silicon areas 206 forms CMOS transistor sources/drains, first polysilicon layer 207 form CMOS transistor gates, and said CMOS wells, said CMOS transistor sources/drains and said CMOS gates form CMOS transistors. First via hole layer 209 acts as CMOS contact and is preferably made of Ti/TiN/CVD-W. Second via hole layer 211, third via hole layer 213 and fourth via hole layer 215 are as CMOS vias and preferably made of Ti/TiN/CVD-W. First metal layer 210, second metal layer 212, third metal layer 214, and fourth metal layer 216 are CMOS metals and preferably made of TiN/Cu/TiN or TiN/AlSi/TiN. Nitride deposition layer 217 is preferably made of $Si_3N_4$, under bump metal (UBM) layer 218 is preferably made of Al/NiV/Cu, and solder spheres 219 are made of Sn. Backside interconnect isolation oxide layer 220 can be made of $SiO^2$, first MEMS bonding layer 221 can be made of AlSi, first metal compound layer 222 can be made of AlSiGe, and second MEMS bonding layer 223 can be made of SiGe. MEMS layer 224 is made of doped silicon. First MEMS eutectic bonding layer 225 can be made of Au or Sn, second metal compound layer 226 can be made of Au or AuSn, and second EMS eutectic bonding layer 227 can be made of the same material as first MEMS eutectic bonding layer 225. MEMS cap layer 228 is made of silicon. It is also worth noting that first MEMS bonding layer 221, first metal compound layer 222, and second MEMS bonding layer 223 form a MEMS bonding area between MEMS layer 224 and CMOS substrate layer 201. Similarly, first MEMS eutectic bonding layer 225, second metal compound layer 226, and second EMS eutectic bonding layer 227 from a MEMS bonding area between MEMS layer 224 and MEMS cap layer 228. Thus, cavities 229 can also be described as existing between MEMS layer 224 and CMOS substrate layer 201, and gap 231 exists between MEMS layer 224 and MEMS cap layer 228, connected through via holes 230 in MEMS layer 224. Via holes 230 act as MEMS motion fingers. It is also worth noting that in the present embodiment, no open holes in MEMS cap layer 228 are required for wire bonding window (WBW), unlike the prior arts shown in FIG. 1C.

Figure 3A:
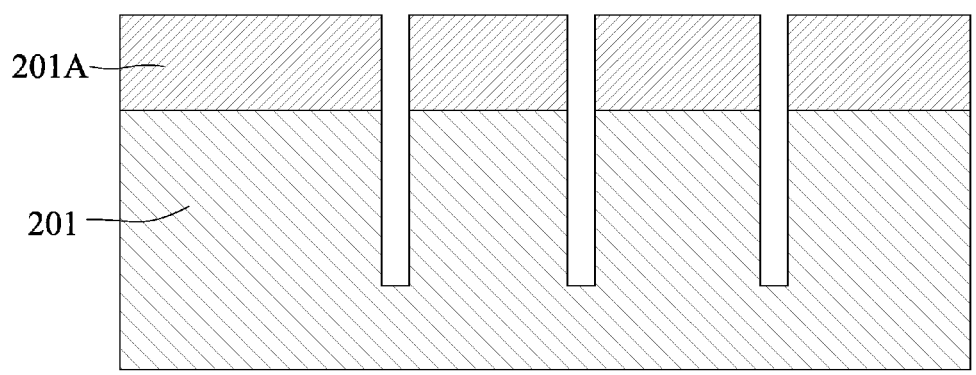
FIGS. 3A-3W show schematic views of an exemplary embodiment of a manufacturing process to fabricate the structure of compact MEMS motion sensor device of the present invention.
Figure 3B:
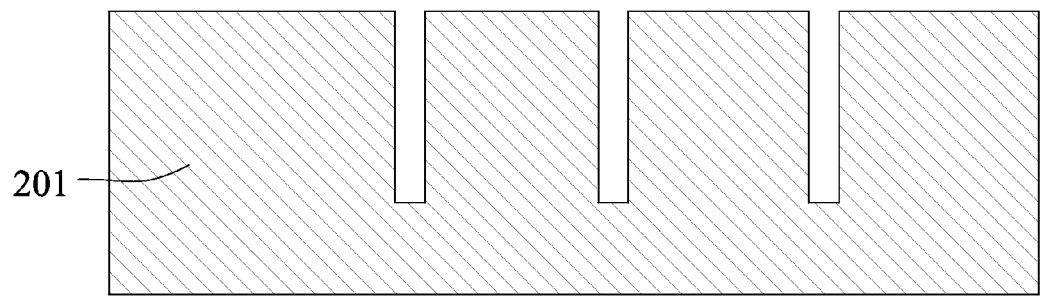
Figure 3C:
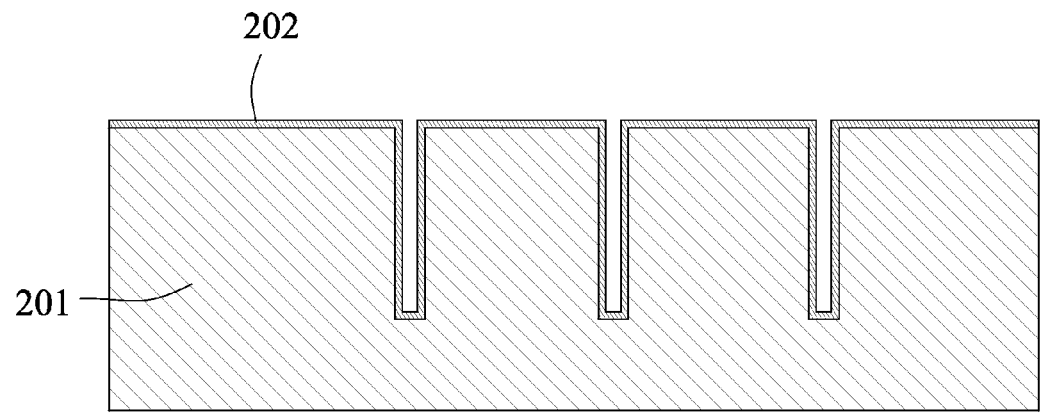
Figure 3D:
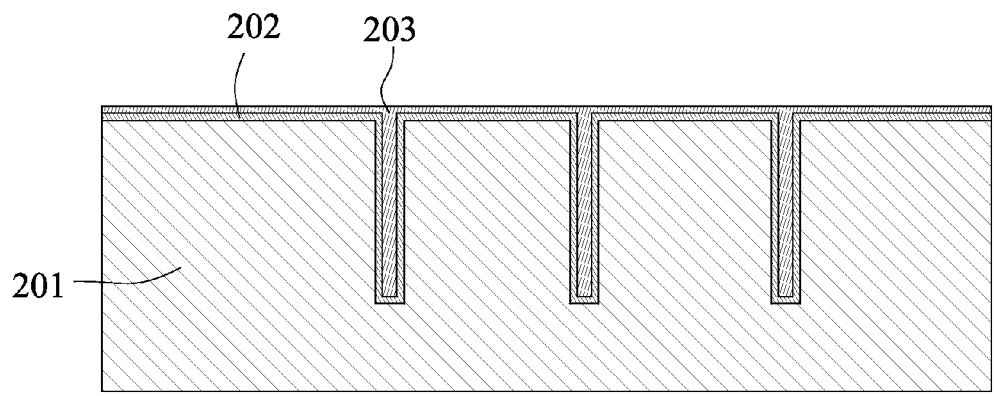
Figure 3E:
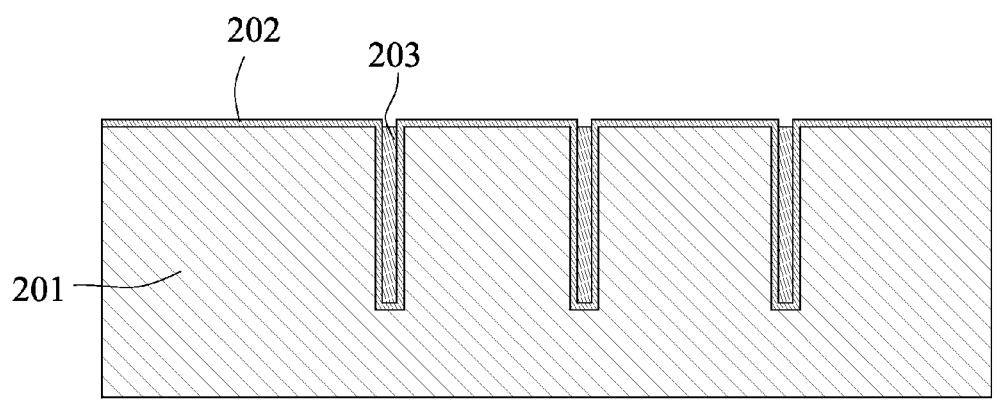
Figure 3F:
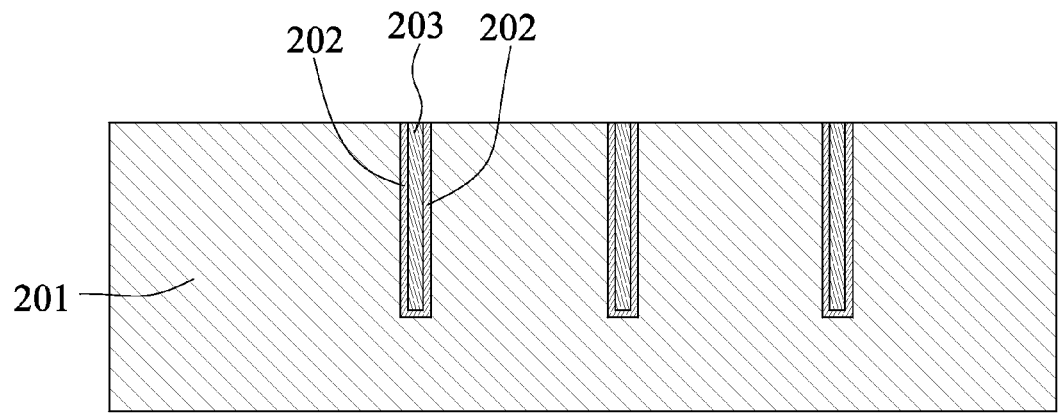
Figure 3G:
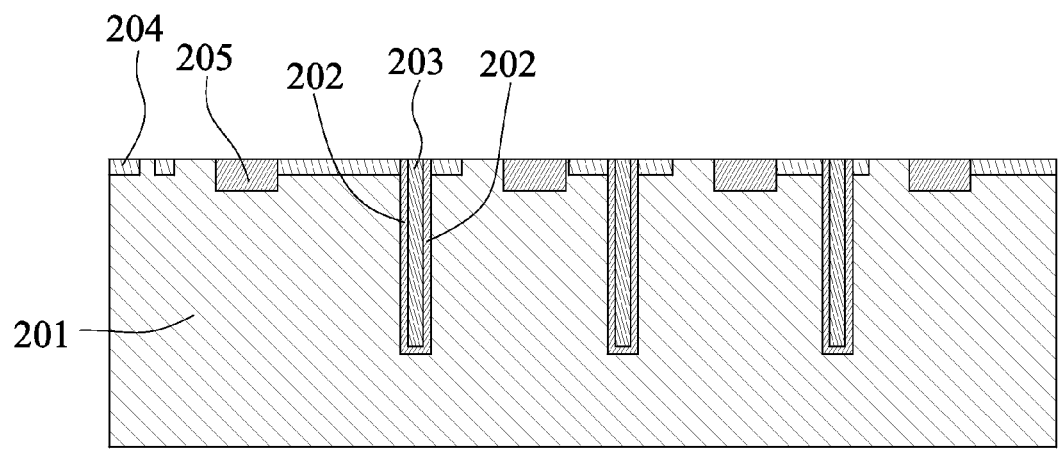
Figure 3H:
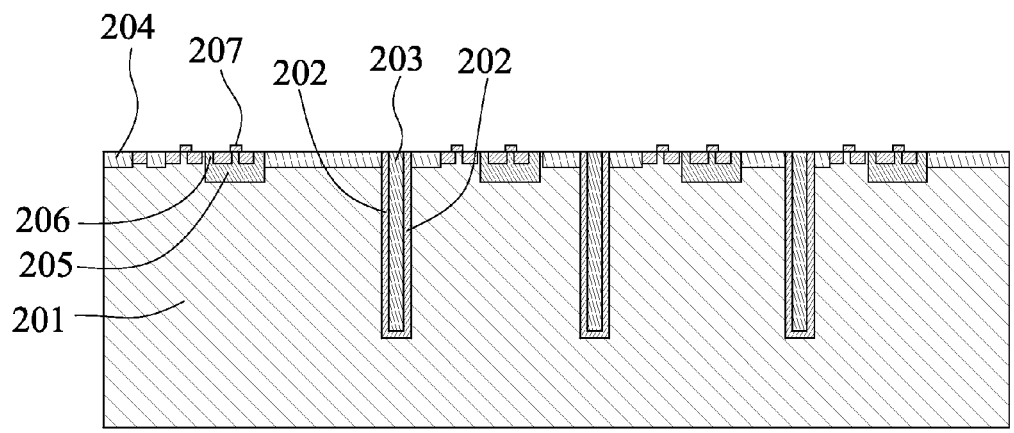
Figure 3I:
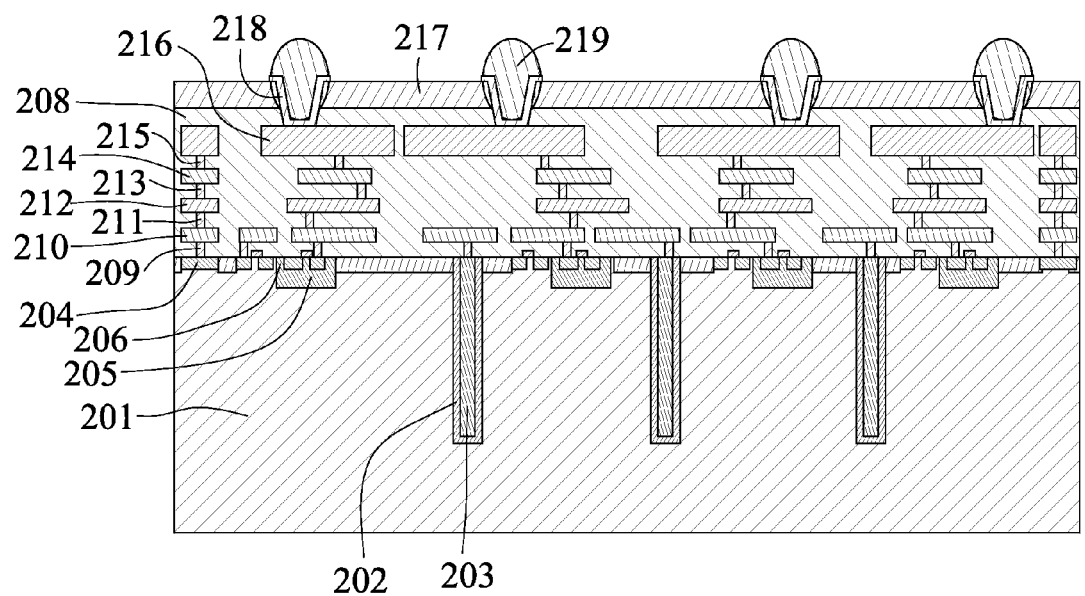
Figure 3J:
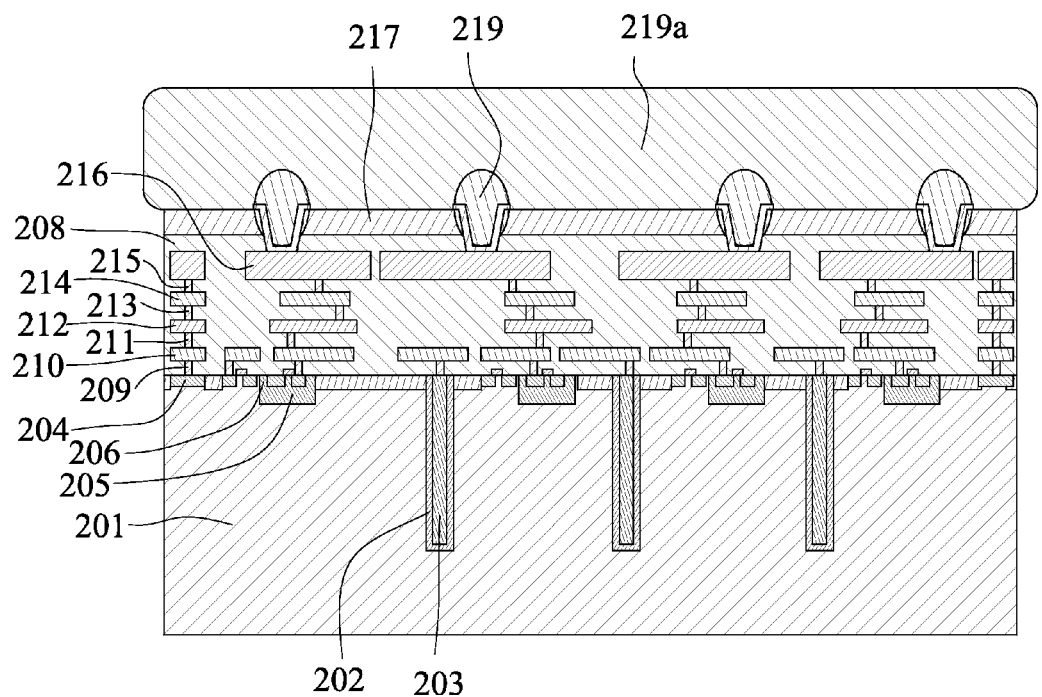
Figure 3K:
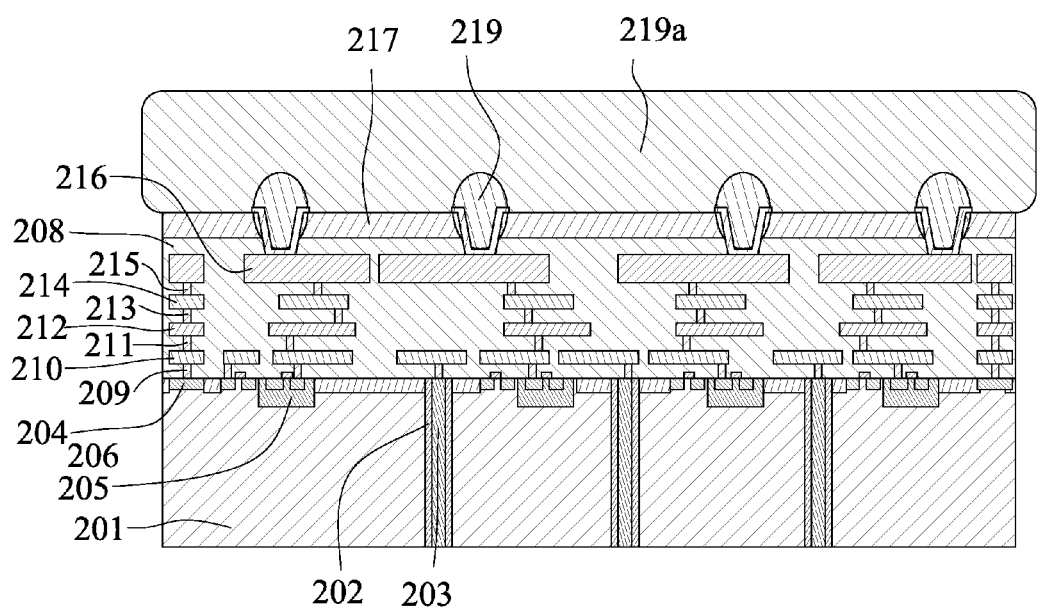
Figure 3L:
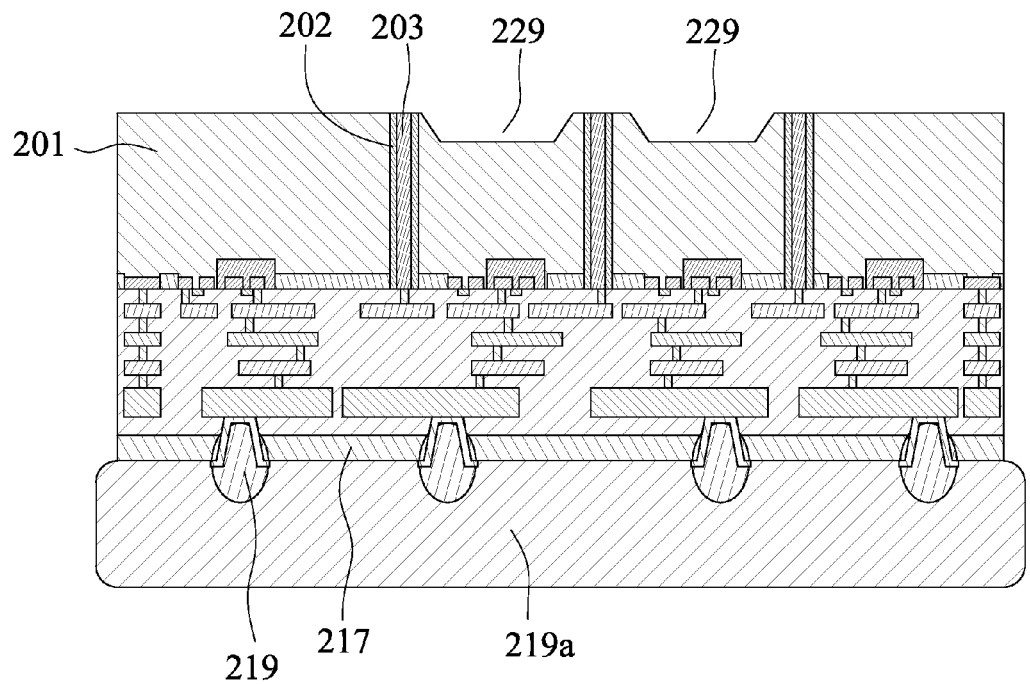
Figure 3M:
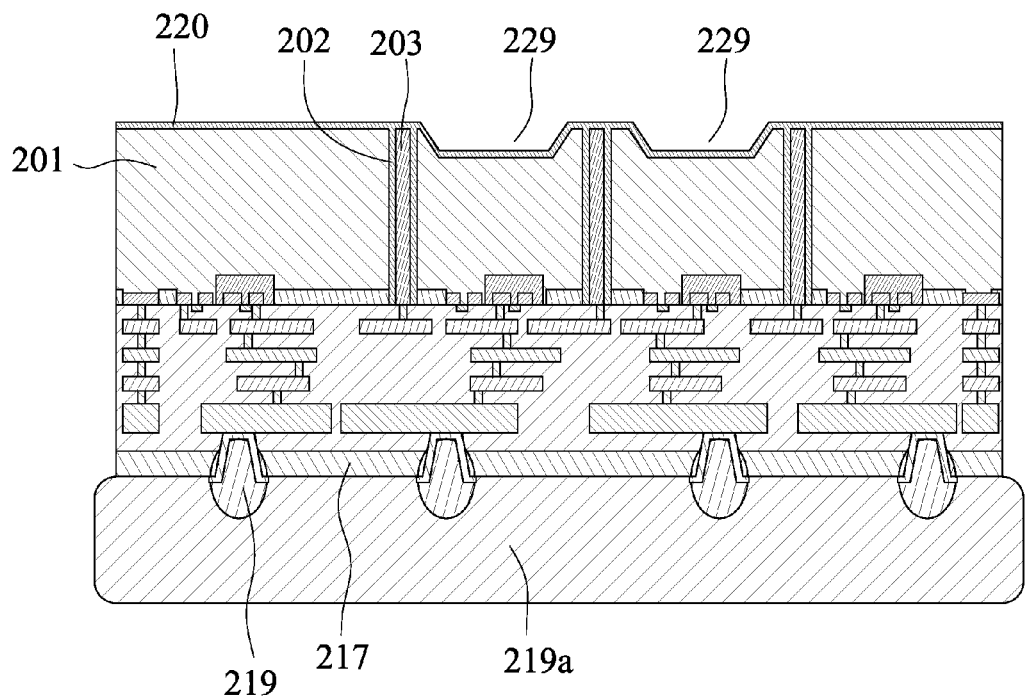
Figure 3N:
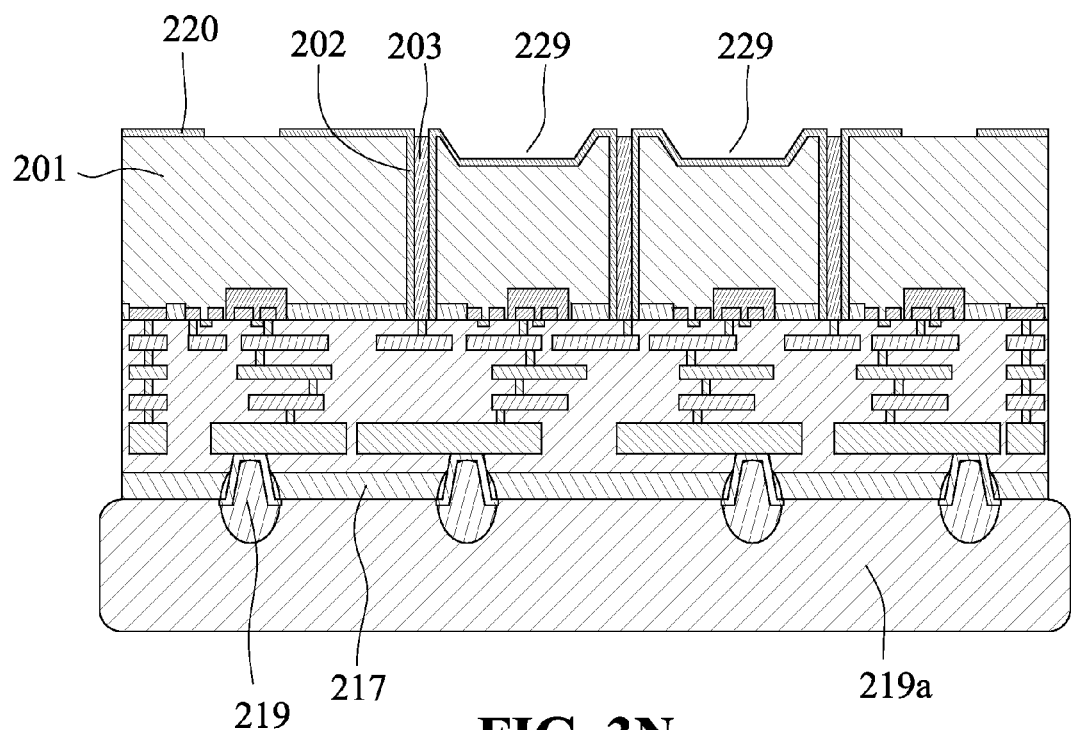
Figure 3O:
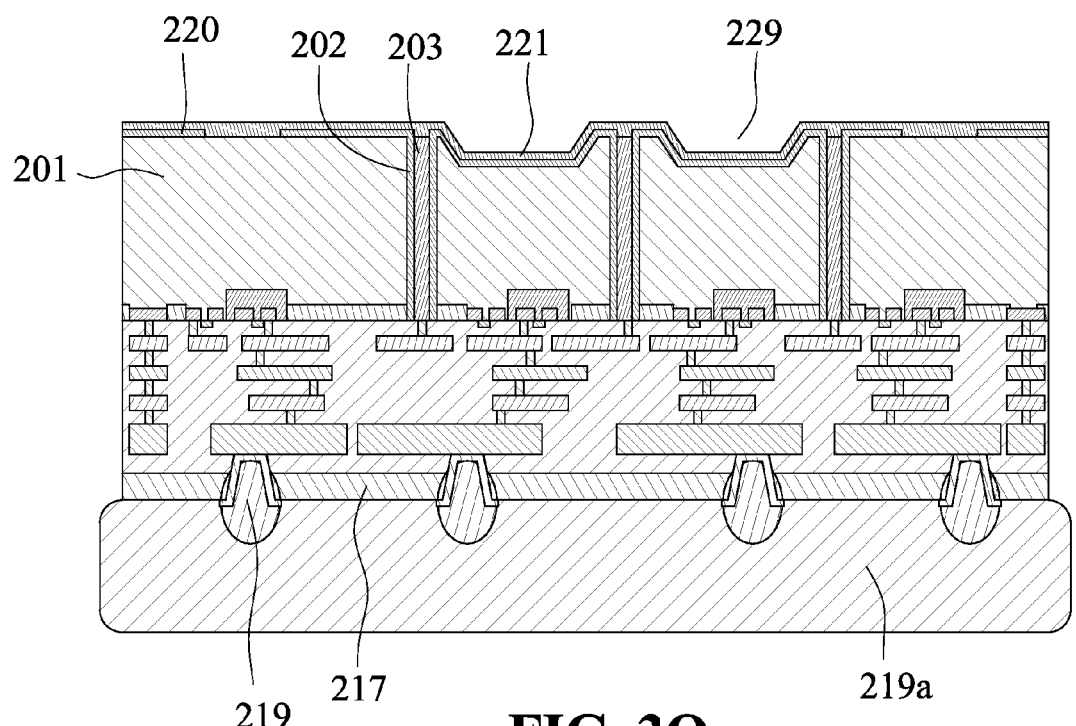
Figure 3P:
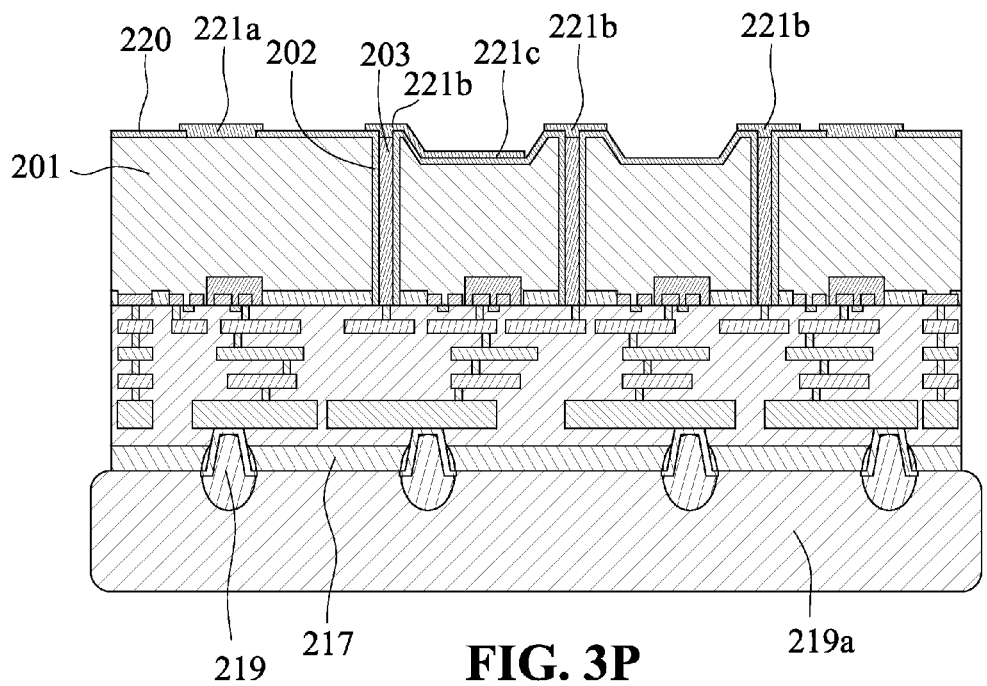
Figure 3Q:
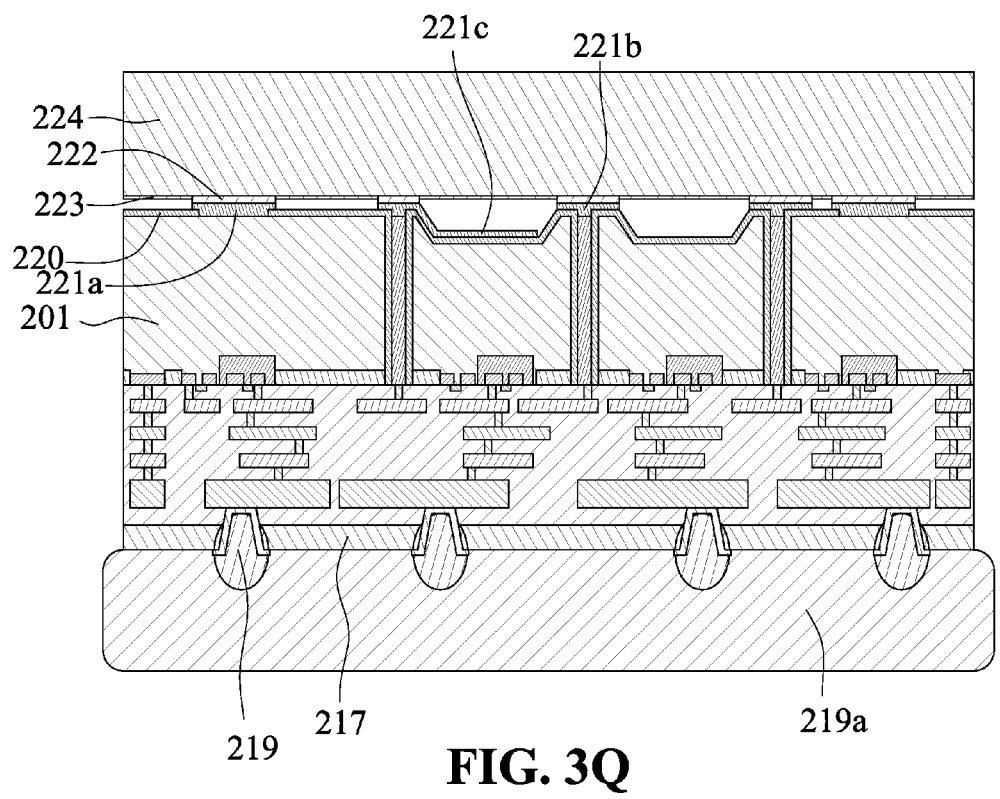
Figure 3R:
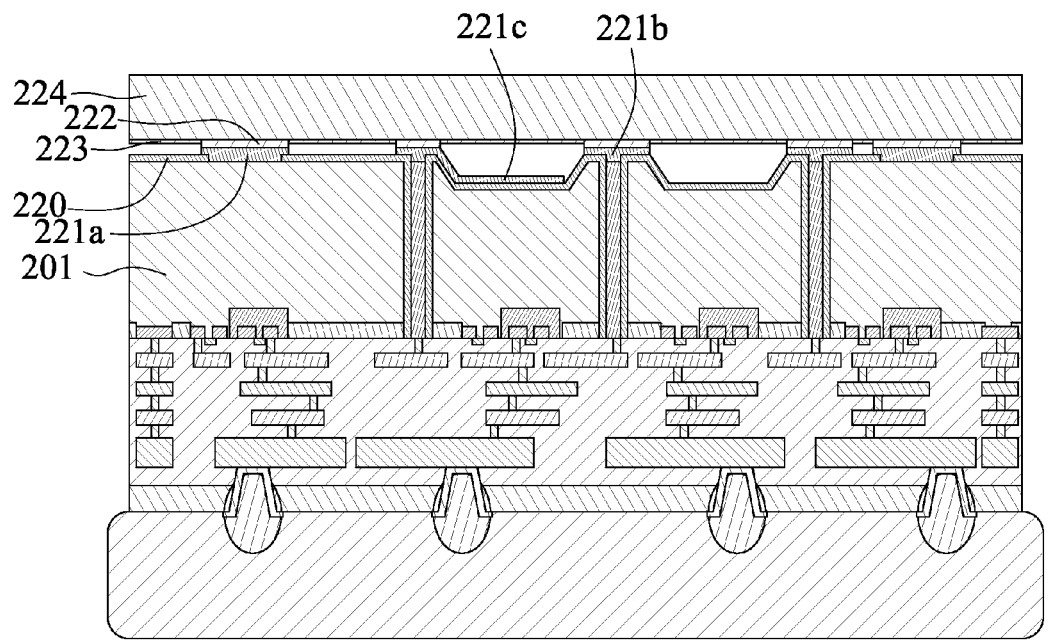
Figure 3S:
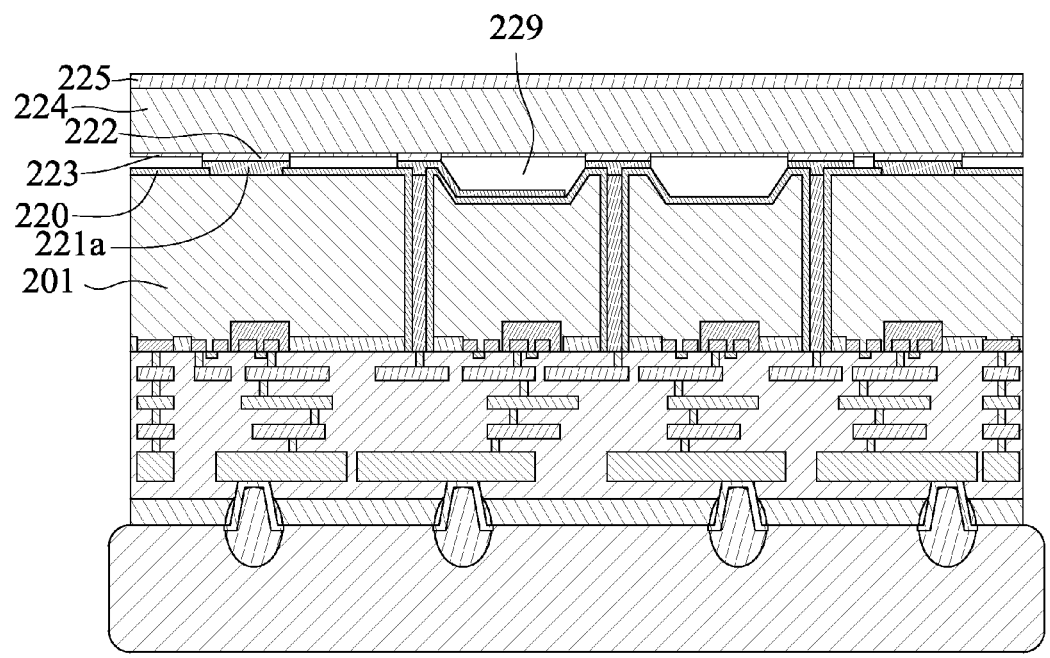
Figure 3T:
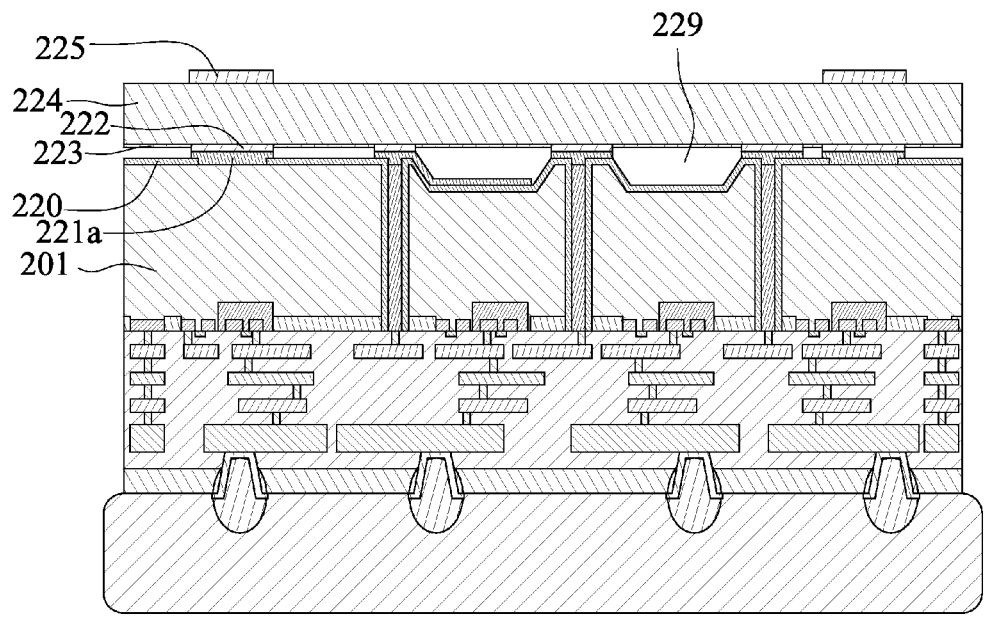
Figure 3U:
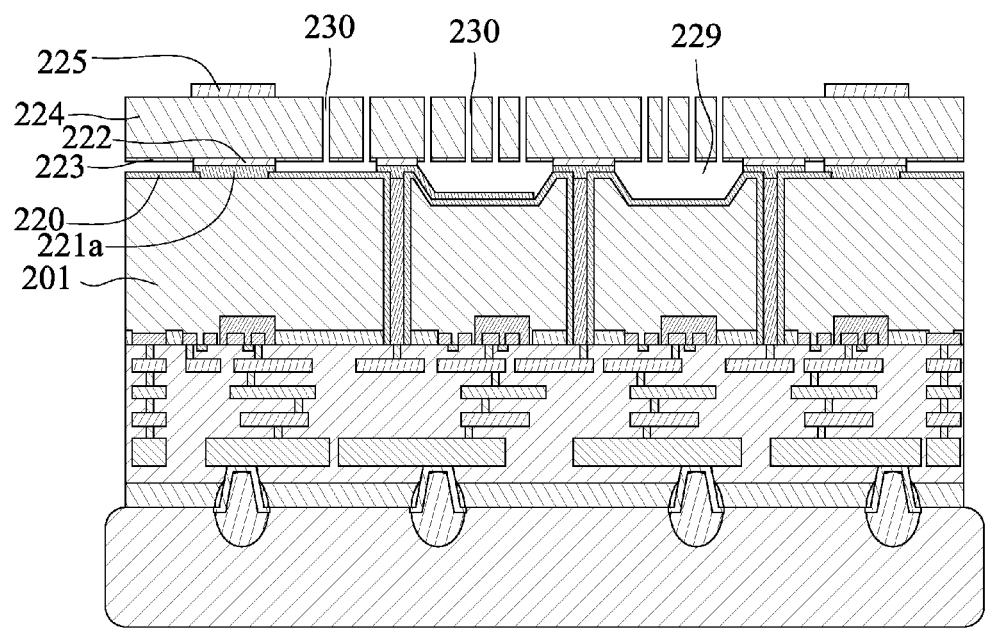
Figure 3V:
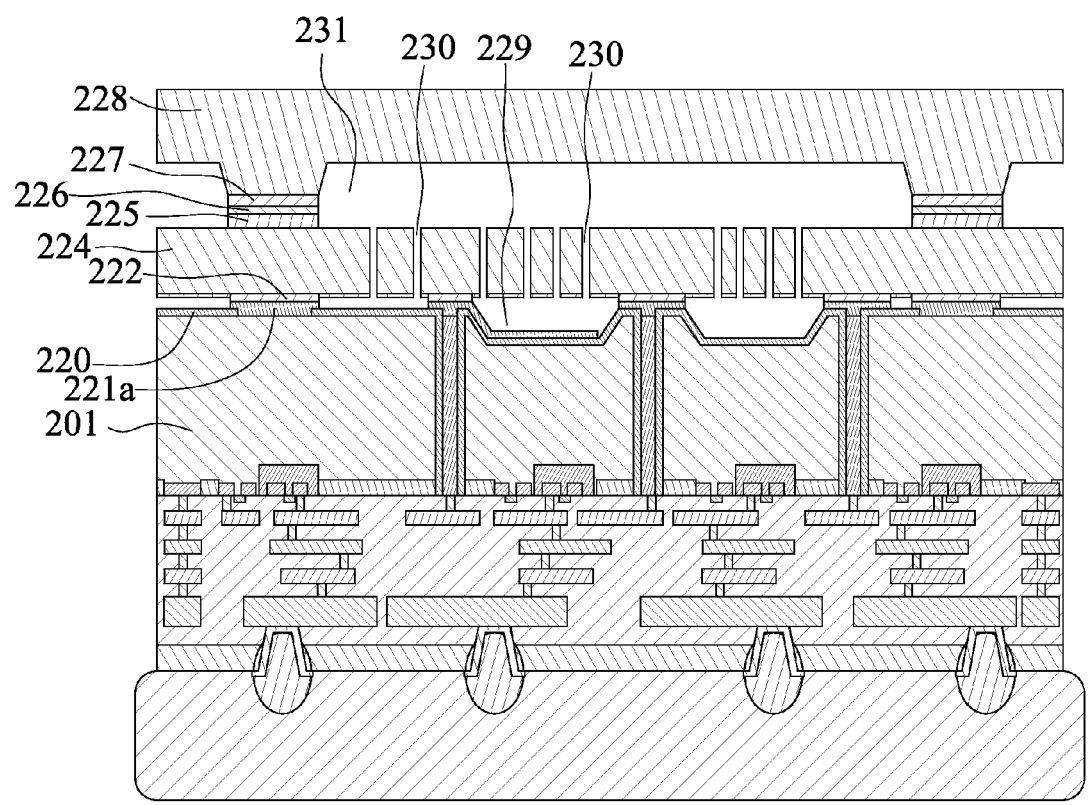
Figure 3W:
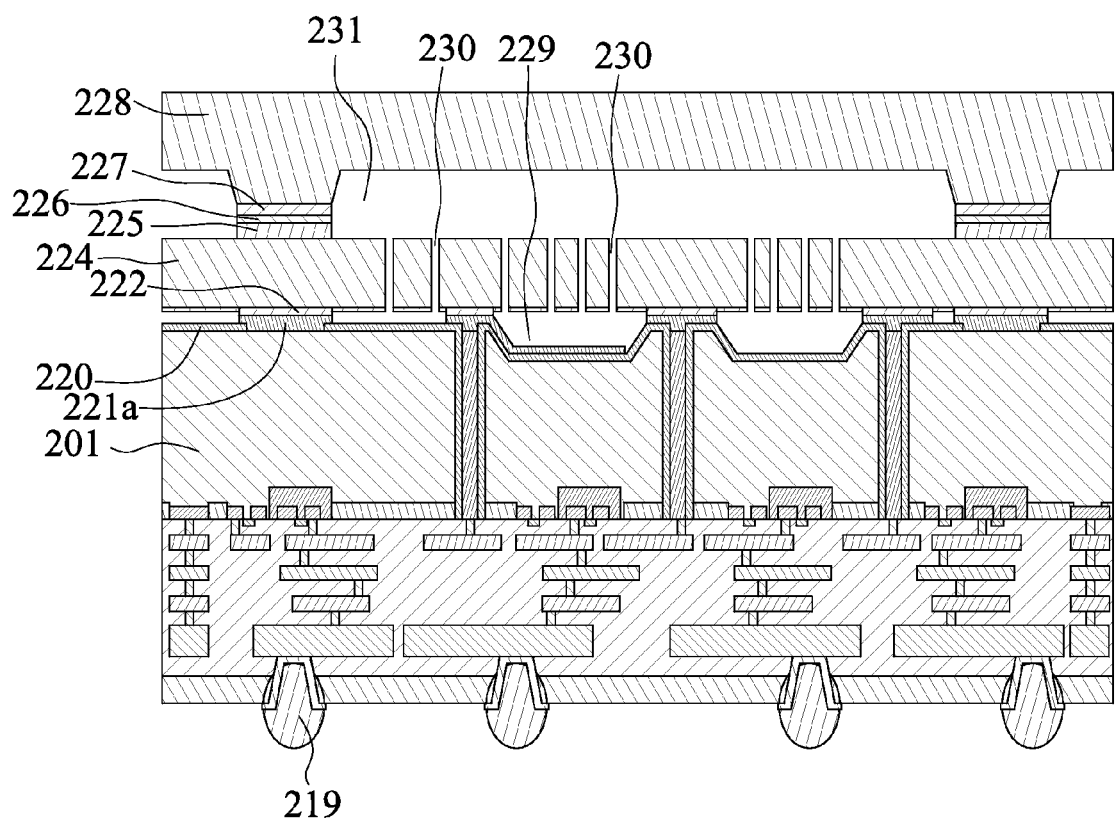

FIGS. 3A-3W show schematic views of an embodiment of a manufacturing process able to fabricate the structure of compact MEMS motion sensor device according to the present invention. However, the process and constituting steps shown in FIGS. 3A-3W are only illustrative, instead of restrictive. Compact MEMS motion sensor devices manufactured in other processes are also within the scope of the present invention.

FIG. 3A shows a schematic view of a fabrication step starting with a silicon wafer substrate prior to CMOS device formation with a photo resist pattern 201a. Deep silicon trench etch is performed to form a plurality of vertical trenches through silicon in CMOS substrate layer 201, as shown in FIG. 3B. The trenches act as anchor posts and are preferably having the depth of 30-100 um. Photo resist pattern 201a is then removed. A thin thermal oxide is grown or a thin LPCVD oxide layer is deposited conformally on the deep trench to form isolation oxide layer 202 of the anchor post, as shown in FIG. 3C, to isolate CMOS substrate layer 201 from the deep poly contact which is to be formed next. The thickness of isolation oxide layer 202 is preferably about 100 A°. Alternatively, a highly reliable Oxide-Nitride-Oxide (ONO) dielectric layer can be formed to serve the isolation purpose and to form a plurality of high density capacitors for CMOS ASIC circuit usage. FIG. 3D shows a schematic view of a highly-doped polysilicon layer deposited conformally into the trench to form anchor posts. The LPCVD doped polysilicon forms conductive layer 203 of anchor posts. The anchor posts may be of dimension, for example, 2.5-5 um in width and 50 um in depth. Polysilicon etch back is then performed to remove the surface polysilicon, as shown in FIG. 3E. An oxide etch back is then performed to remove the surface oxide as shown in FIG. 3F. Up to this point, the anchor posts made of deep trench polysilicon are formed. The wafer then follows with ASIC CMOS device fabrication steps forming CMOS well layer 205 and field oxide isolation layer 204, as shown in FIG. 3G. Subsequently, CMOS transistor source/drains 206 and CMOS transistor gates 207 are formed to complete CMOS transistor formation, as shown in FIG. 3H. The process then followed by CMOS interconnect formation, including fabricating first via hole layer 209, first metal layer 210, second via hole layer 211, second metal layer 212, third via hole layer 213, third metal layer 214, fourth via hole layer 215 and fourth metal layer 216 forming a scribe seal, and all immersed in oxide layer 208, which may be fabricated as Inter-Level-oxide (ILD) or Multi-Layer-Oxide (MLD). It is worth noting that the number of metal layers and interleaving via hole layers can be varied to meet different design requirements. Also, first via hole layer 209 also acts as CMOS contacts. Then, the process is subsequently followed by Flip Chip bumping technology, including fabricating Nitride deposition layer 217, under bump metal (UBM) layer 218, and solder spheres 219. The resulting structure is shown in FIG. 3I. If a wire bonding is preferred, then a CMOS metal bond pad is used without Flip Chip bumping process. So far, a complete CMOS wafer with deep trench polysilicon is made without altering CMOS device characteristics.

FIG. 3J shows a schematic view of attaching the wafer to a temporary carrier wafer 219a with a carrier wafer adhesive. The wafer then undergoes a back grind step to perform wafer thinning until the polysilicon contacts, i.e., the anchor posts, are exposed as shown in FIG. 3K. The process is then switched to the other side of CMOS substrate layer 201. For the convenience of reading, FIG. 3L shows a view of CMOS wafer placed upside down, which is different from the view in FIG. 3K. A substrate silicon pattern and silicon etch are then performed with the depth primarily determined by the Z-axis motion distance of the MEMS devices and is chosen in this case to be roughly 2-5 um depth forming cavities 229, as shown in FIG. 3L. A thin layer of PECVD oxide is deposited onto the etched silicon to form backside interconnect isolation oxide layer 220 for isolating a backside interconnect layer from the CMOS substrate layer 201, as shown in FIG. 3M. Backside VIAs are patterned and etched as shown in FIG. 3N. Then, first metal MEMS bonding layer 221 is deposited, as shown in FIG. 3O, followed by photo resist pattern and etch for forming MEMS bonding areas 221a and MEMS anchors 221b, and Z-axis capacitor plate 221c, as shown in FIG. 3P. First MEMS bonding layer 220 serves three purposes: the first purpose is to be used as a wafer bonding material for wafer bonding in MEMS bonding area 221a, i.e., the MEMS bonding area for CMOS substrate layer 201 and MEMS layer 224; the second purpose is to act as an interconnect to the anchors 221b for connecting MEMS signal to CMOS ASIC input terminals on the top side of the CMOS circuits through trench polysilicon conductive layer 203; and the third purpose is to act as a capacitor plate 221c for sensing Z-axis motion. When the motion is along the Z-direction, the capacitance between MEMS layer 224 and capacitor plate 221c changes and the differential capacitance signal will be detected by the ASIC circuits in CMOS area. The material of first MEMS bonding layer 221 can be the same as the top metal layer of a CMOS ASIC circuit, with preference being aluminum silicon (AlSi) or derived compound.

Similarly, conductive doped deep trench polysilicon, that is, anchor post with isolation oxide layer 202 and conductive layer 203, serves several purposes. Deep trench polysilicon provides a mechanical anchor/post for MEMS fingers, provides electrical signal connections to ASIC circuits for MEMS fingers, and also provides interconnects for Z-axis capacitor plates to the ASIC circuits. The aforementioned MEMS fingers are used to detect motion behaviors and play a central part of the device.

A thick MEMS wafer 224 blanket-coated with a thin MEMS bonding layer 223 is then bonded with CMOS substrate layer 201 through MEMS bonding layer 221 to form a Hermetic sealing of the MEMS device, as shown in FIG. 3Q. MEMS bonding layer 223 is made of Germanium film, preferably about 600-1000 A°. During low temperature bonding process, the AlSi compound materials on MEMS bonding layer 221 and Germanium form an AlSiGe compound for hermetic sealing, that is, first resulting metal compound layer 222. The low temperature wafer bonding is needed since the interconnect metal in the CMOS circuits cannot sustain high temperature. It should be noted that precision wafer to wafer alignment is not needed during this MEMS to CMOS substrate wafer bonding process.

MEMS layer 224 then undergoes MEMS wafer thinning step to obtain desired MEMS thickness, for example, 30-50 um, as shown in FIG. 3R. First metal MEMS eutectic bonding layer 225 is deposited onto MEMS layer 224, as shown in FIG. 3S, and then patterned and etched to define MEMS bonding areas, as shown in FIG. 3T. An eutectic wafer bonding is performed. This eutectic wafer bonding can be gold-gold wafer bonding for low temperature wafer bonding process with high re-melt temperature after bonding and thus the metal of first MEMS eutectic bonding layer 225 can be gold (Au). A low temperature Au—Sn wafer bonding is also applicable. FIG. 3U shows a schematic view of the resulting wafer then undergone MEMS photo resist pattern and etch steps to form MEMS motion fingers, that is, by using via holes 230 of FIG. 2. Capacitance forms between these fingers. When there is motion, the capacitance changes and the differential capacitance by motion will be detected by ASIC circuits.

During the etch step, the thin Germanium on the MEMS wafer can serve as an end-point detection to signal the end of etching on the MEMS silicon. The same ICP process to etch silicon will etch Germanium as easily.

Silicon cap layer 228 with recessed silicon area, also called Cap-recess area, which is labeled as gap 231 of FIG. 2, to allow gap in between the MEMS motion fingers and cap layer 228, and a pre-defined bonding pad, i.e., second MEMS eutectic bonding layer 227 at MEMS bonding area are bonded with the first MEMS eutectic bonding layer 225 to allow for hermetic seal, and result in a metal compound layer 226 of Au or AuSn, after bonding process, as shown in FIG. 3V. MEMS bonding area to cap layer 228 and MEMS bonding area to CMOS substrate layer 201 can be aligned with each other, as shown in FIG. 3V. As aforementioned, since the wafer bonding pads are on the top side of the CMOS wafer, no open holes on the cap wafer are needed as in the conventional MEMS; hence, the present invention has simplified the cap wafer design and process, as well as reduced the final chip size as there are large design rule requirements for the cap holes reserved for the wire bonding and the ASIC bond pads due to wafer alignment accuracy for wafer bonding.

Figure 4:
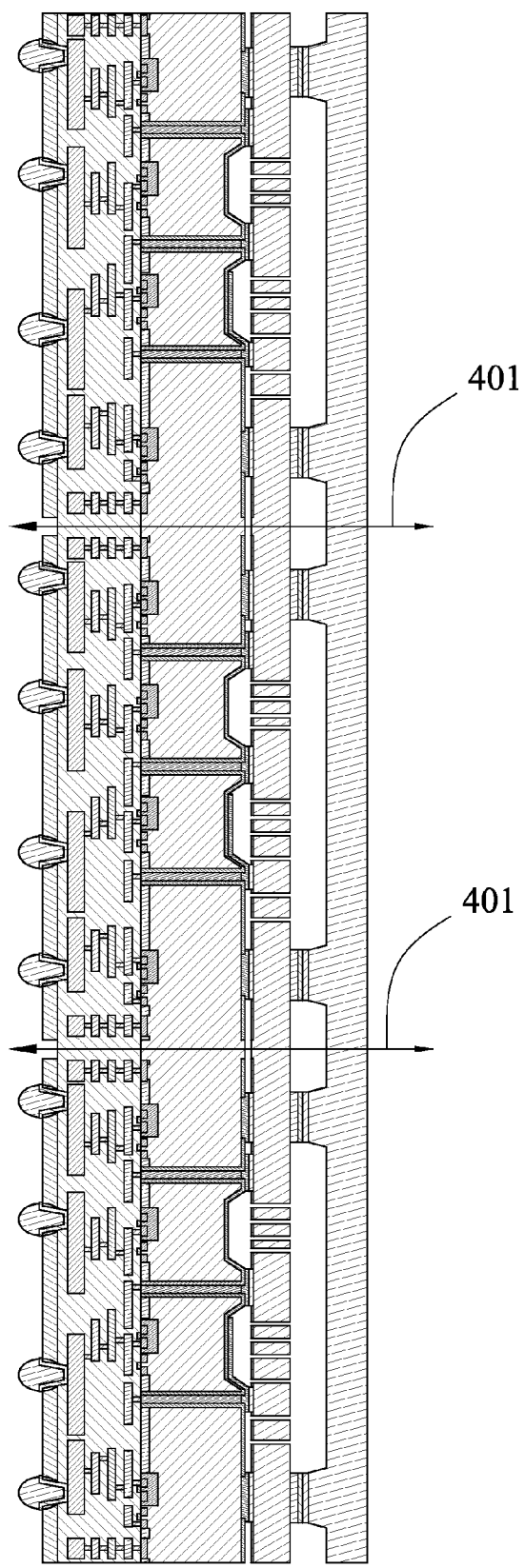
FIG. 4 shows a schematic view of scribe line areas and associated cutting lines during a die-saw process according to the present invention.

After the cap bonding, carrier wafer 219a is then detached and the temporary bonding materials are removed as shown in FIG. 3W. Also, as shown in FIG. 3W, both MEMS bonding areas to cap layer and to CMOS substrate are aligned such that both are within the boundary of CMOS ASIC circuit scribe line area. Therefore, a common ASIC die saw process and tools through scribe line area are readily available for the integrated compact MEMS device. FIG. 4 shows a schematic view of scribe lines area. As an example, the completed wafers are die-sawed along line 401 through scribe line area to form individual dies, as shown in FIG. 4.

It should be noted that in the present invention, two wafer-to-wafer bonding processes are performed. The first is MEMS to the substrate of CMOS wafer, the second is the cap wafer to MEMS wafer. The first does not require precision wafer alignment because of the use of blanket-coated thin Germanium layer on MEMS wafers. The second does not require precision wafer alignment because of no requirement of wire bond window (WBW) hole-opening on the cap wafer for wire bonding pads. Thus, a low cost and small size chip can be produced with the present invention.

Those familiar with the art know that both eutectic wafer bonding can be made to work as long as the bonding temperature is lower than the CMOS metal interconnect withstanding temperature. One of the simplest ways is to implement the wafer bonding with transient liquid phase (TLP) eutectic wafer bonding technology in which the bonding temperature is relative low, but the re-melt temperature is considered high. The wafer bonding as described in the present invention will be easily implemented.

It should also be noted that wire bonding can also be made to replace the flip chip bonding in the present invention in case the wire bonding is necessary, by the omission of the CMOS bumping process module in this invention in FIG. 3I.

Figure 5:
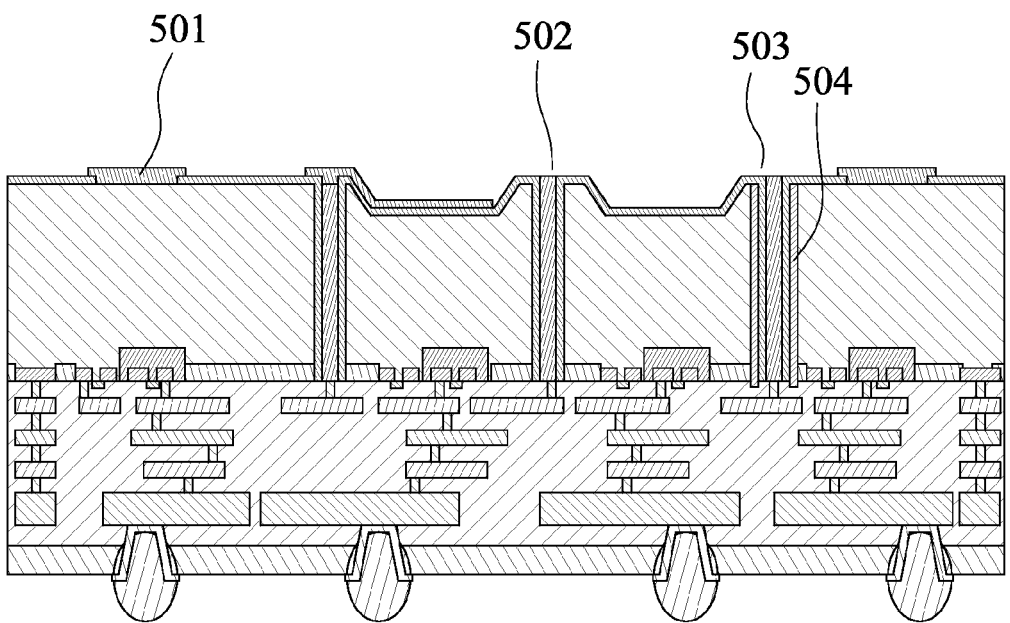
FIG. 5 shows a schematic view of fabricating ground capacitors and isolated trench capacitors in the structure of compact MEMS motion sensor device according to the present invention.

While the trench polysilicon is designed for the purpose of interconnecting MEMS and ASIC, however, the trench polysilicon can also be easily used to form a high density area of efficient capacitor array for the purpose of decoupling capacitance, when an on-chip large capacitance is needed, or to replace off-chip external capacitor. FIG. 5 shows a schematic view of forming ground capacitors and isolated trench capacitors according to the present invention. As shown in FIG. 5, a ground capacitor 502 can be formed using polysilicon contact as top capacitor electrode and substrate as a ground electrode. Similarly, an isolated capacitor 503 can be formed by angled N+ ion implant into the sidewall of the trench in FIG. 3B to form isolated capacitor plates 504 prior to fabricating isolation oxide layer 202. The oxide at the bottom of the trench capacitor isolates itself from the MEMS device. In addition, large capacitance can be formed with many such trench capacitors connected in parallel. The MEMS bonding areas are labeled as 501.

Figure 6A:
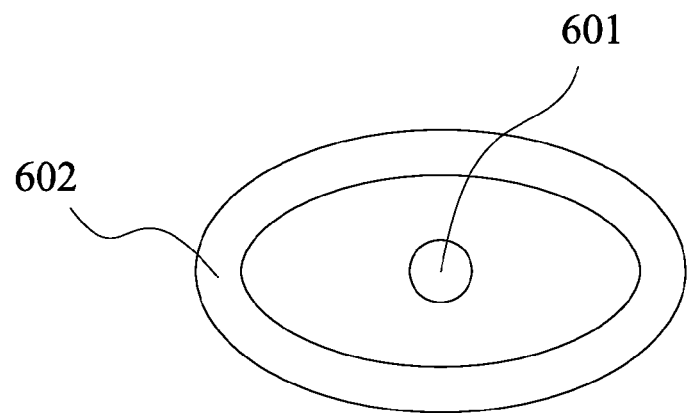
FIG. 6A shows a top view of forming a vertical coaxial cable using deep trench polysilicon according to the present invention.
Figure 6B:
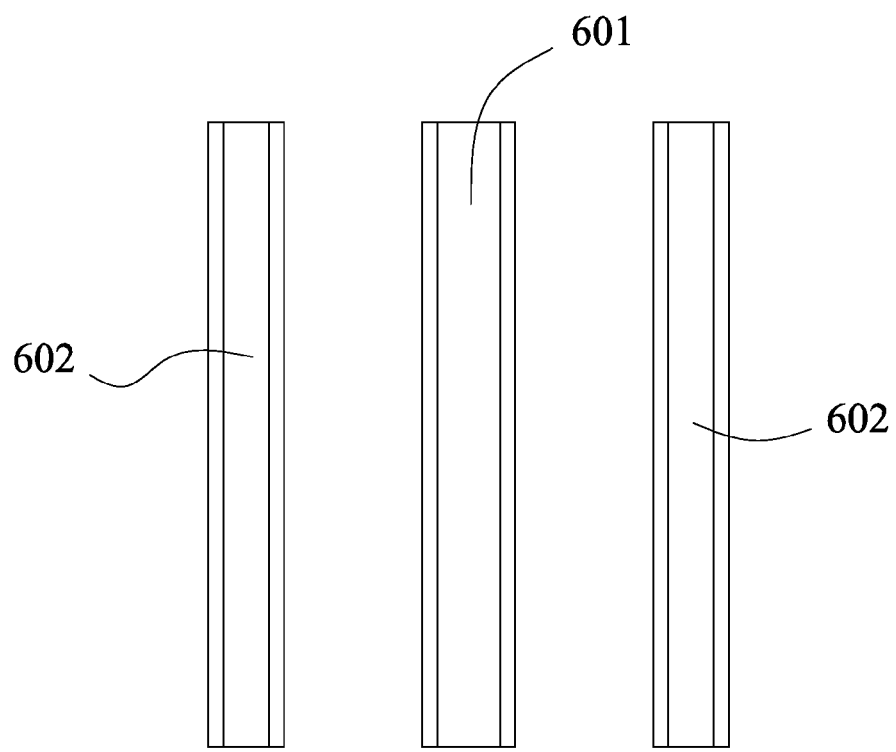
FIG. 6B shows a cross-sectional side view of forming a vertical coaxial cable using deep trench polysilicon according to the present invention.
Figure 6C:
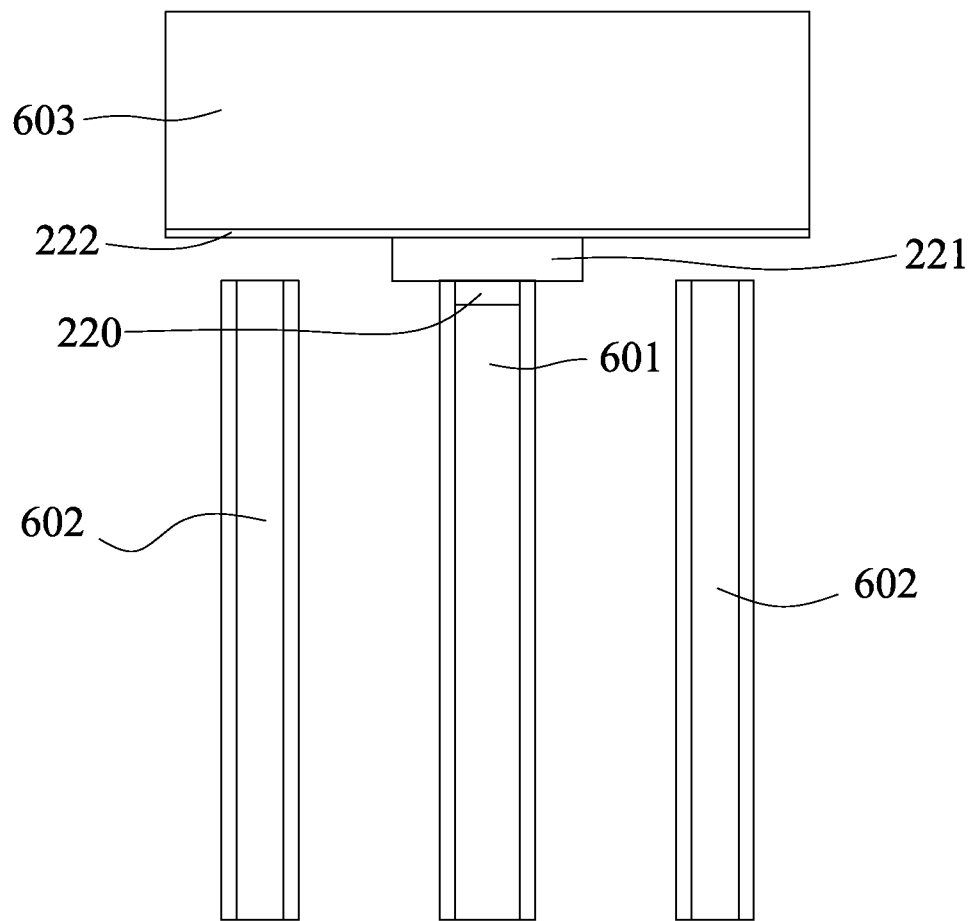
FIG. 6C shows a schematic view of attaching a vertical coaxial cable to a MEMS die according to the present invention.

FIGS. 6A-6C shows schematic views of forming a vertical coaxial cable by using the deep trench polysilicon according to the present invention. FIG. 6A shows a top view of a polysilicon trench ring 602 surrounding a center trench polysilicon contact post 601, and FIG. 6B shows a cross-sectional side view of the vertical coaxial cable in FIG. 6A. FIG. 6C shows a schematic view of attaching a vertical coaxial cable to a MEMS die according to the present invention. As shown in FIG. 6C, a MEMS die 603 is attached to deep trench polysilicon acting as a vertical coaxial cable through the bonding layers, including isolation oxide layer 220, first MEMS bonding layer 221, and first metal compound layer 222. The vertical coaxial cable can minimize a stray capacitance of a signal connection line.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A compact MEMS motion sensor device, applicable to both flip chip and wire bonding technologies, said device comprising:
   a CMOS substrate layer;
   a plurality of anchor posts, embedded inside and penetrating through said CMOS substrate layer, each anchor post of said plurality of anchor posts having an isolation oxide layer surrounding a conductive layer;
   a CMOS ASIC device module, fabricated on a top side of said CMOS substrate layer, further comprising:
      a field oxide (FOX) layer;
      a first set of implant doped silicon areas forming CMOS wells;
      a second set of implant doped silicon areas forming CMOS sources/drains;
      a first polysilicon layer forming CMOS transistor gates, said CMOS wells, said CMOS sources/drains and said CMOS transistor gates forming CMOS transistors;
      an oxide layer embedded with a plurality of metal layers interleaved with a plurality of via hole layers, a first via hole layer of said plurality of via hole layers acting as CMOS contacts and remaining via hole layers acting as CMOS vias, said plurality of metals layers and said plurality of via hole layers forming a scribe seal;
      a Nitride deposition layer;
      an under bump metal (UBM) layer; and
      a plurality of solder spheres, said UBM layer and said plurality of solder spheres forming a flip chip bump layer; and
   a MEMS device module, attached on a backside of said CMOS substrate layer, further comprising:
      a backside interconnect isolation oxide layer, for isolating said MEMS device module from said CMOS substrate layer;
      a first MEMS bonding layer;

a second MEMS bonding layer;
a first metal compound layer, located between said first MEMS bonding layer and said second MEMS bonding layer;
a MEMS layer, having a plurality of via holes for forming MEMS motion fingers;
a first MEMS eutectic bonding layer;
a second MEMS eutectic bonding layer;
a second metal compound layer, located between said first MEMS eutectic bonding layer and said second MEMS eutectic bonding layer; and
a MEMS cap layer;
wherein a plurality of cavities exists between said backside interconnect isolation oxide layer and said second MEMS bonding layer, and a gap exists between said MEMS layer and said MEMS cap layer, said plurality of via holes in said MEMS layer connecting said plurality of cavities and said gap, and said plurality of anchor posts serving as signal interconnects and anchors for said MEMS device module and said CMOS ASIC device module.

2. The compact MEMS motion sensor device as claimed in claim 1, wherein said MEMS device module is bonded to a backside of a CMOS wafer comprising said CMOS ASIC device module.

3. The compact MEMS motion sensor device as claimed in claim 1, wherein said MEMS cap layer is bonded to said MEMS layer.

4. The compact MEMS motion sensor device as claimed in claim 1, wherein said plurality of anchor posts are polysilicon trenches for avoiding disturbance to CMOS device characteristics of said CMOS ASIC device module.

5. The compact MEMS motion sensor device as claimed in claim 2, wherein a MEMS wafer comprising said MEMS device module and having a desired thickness is bonded onto said CMOS substrate layer where interconnects are made.

6. The compact MEMS motion sensor device as claimed in claim 5, wherein said MEMS cap layer is bonded at a backside of said MEMS wafer with bonding areas coinciding with bonding areas of said MEMS wafer and said CMOS wafer for area savings.

7. The compact MEMS motion sensor device as claimed in claim 1, wherein said MEMS cap layer does not comprise any hole opening when using with flip chip technology.

8. The compact MEMS motion sensor device as claimed in claim 1, wherein die saw area for cutting wafer into individual dies is the same as CMOS ASIC module scribe line area.

9. The compact MEMS motion sensor device as claimed in claim 1, wherein said plurality of cavities formed between said CMOS substrate layer and said MEMS layer is formed by etching said CMOS substrate layer, and said plurality of cavities forms a Z-axis capacitor.

10. The compact MEMS motion sensor device as claimed in claim 1, wherein capacitance forms between said MEMS motion fingers, and when motion occurs, said capacitance changes and differential capacitance caused by motion is detected by said CMOS ASIC device module.

11. The compact MEMS motion sensor device as claimed in claim 5, wherein a thin Germanium film on said MEMS wafer serves as an endpoint detection to signal an end of etching on said MEMS wafer during an etch process.

12. The compact MEMS motion sensor device as claimed in claim 1, wherein ground capacitors are formed by using said conductive layer in each anchor post as a top capacitor electrode and said CMOS substrate layer as a ground electrode.

13. The compact MEMS motion sensor device as claimed in claim 4, wherein trench capacitors are formed by angled N+ ion implant into sidewalls of said polysilicon trenches of said plurality of anchor posts to form isolated capacitor plates.

14. The compact MEMS motion sensor device as claimed in claim 13, wherein said isolation oxide layer at bottom of said trench capacitors isolates said MEMS device module.

15. The compact MEMS motion sensor device as claimed in claim 14, wherein large capacitance is formed with a plurality of said trench capacitors connected in parallel.

16. The compact MEMS motion sensor device as claimed in claim 15, wherein said trench capacitors are formed as a high efficiency capacitor for said CMOS ASIC device module.

17. The compact MEMS motion sensor device as claimed in claim 16, wherein said trench capacitors are made by using a highly capacitive and reliable Oxide-Nitride-Oxide (ONO) dielectric.

18. The compact MEMS motion sensor device as claimed in claim 1, wherein a vertical coaxial cable is formed by fabricating a polysilicon trench acting as a shielding ring surrounding a central polysilicon trench acting as a main signal connection.

19. The compact MEMS motion sensor device as claimed in claim 18, wherein said vertical coaxial cable reduces stray capacitance of a signal connection line.

* * * * *